United States Patent [19]

Dinter

[11] 4,358,740
[45] Nov. 9, 1982

[54] VOLTAGE CONTROL OSCILLATOR HAVING FREQUENCY CONTROL CIRCUIT WITH IMPROVED MEMORY

[75] Inventor: Konrad M. Dinter, Lawrenceville, N.J.

[73] Assignee: RCA Corporation, New York, N.Y.

[21] Appl. No.: 201,435

[22] Filed: Oct. 28, 1980

[30] Foreign Application Priority Data

Apr. 8, 1980 [GB] United Kingdom ............... 8011555

[51] Int. Cl.³ .............................................. H03L 7/14
[52] U.S. Cl. .................................. 331/1 A; 328/133; 331/20; 331/25; 358/158
[58] Field of Search ..................... 331/1 A, 25, 27, 18, 331/20; 328/133, 134, 155; 358/158; 360/37

[56] References Cited

U.S. PATENT DOCUMENTS 4,112,383  9/1978  Burgert ............................ 331/25 X

OTHER PUBLICATIONS

Oshiro, "Exclusive-OR IC's Serve for Phase-Locking Tasks", Electronics, Jun. 22, 1970, p. 83.

Primary Examiner—Siegfried H. Grimm
Attorney, Agent, or Firm—E. M. Whitacre; W. H. Meise; H. I. Steckler

[57] ABSTRACT

A VCO control circuit features a first exclusive-OR gate to the inputs of which are applied signals derived from the VCO to provide an output signal that has a 90° phase shift with respect to a reference signal. A second exclusive-OR gate serves as a phase detector for the output and reference signals and provides, after filtering, a frequency control voltage for the VCO. The control voltage has about the same amplitude regardless of the presence or absence of the reference signal.

5 Claims, 2 Drawing Figures

VOLTAGE CONTROL OSCILLATOR HAVING FREQUENCY CONTROL CIRCUIT WITH IMPROVED MEMORY

BACKGROUND OF THE INVENTION

The present invention relates to voltage controlled oscillators (VCO), and more particularly, those that are used in television recorders.

Voltage control oscillators are oscillators where the generated frequency is controlled by a voltage applied to the oscillator. Therefore, these oscillators are useful in applications where a reference frequency signal and the voltage control oscillator output signal have to be phase locked together. If one needs a signal at a frequency which is a multiple of a reference frequency, it is typical to use a voltage control oscillator to generate the signal, apply a sample of its output signal to a divide-by-N counter or divider, and then compare the output signal of the divider with the reference signal, so that the VCO output signal frequency is N times as high as the reference frequency. These kind of oscillators are used, for instance, in video tape machines, especially for the so-called "Gen-Lock" module used during recording, which module has an internal frequency generator, so that the machine is running very close to standard recording speed when no video reference signal is coming in. On the other hand, the machine has to lock to the incoming reference signal almost immediately when the reference signal is available. Because the tolerances of the incoming video signals are standardized and must not exceed the tolerances which are laid down in the SMPTE Rules and Recommendations, one would like to have a voltage control oscillator which keeps its frequency within this range, even if there is no incoming reference signal. This requires an oscillator frequency control voltage when no reference signal is present which is as close as possible to the control voltage when an incoming signal is present.

It is therefore desirable to have a control voltage for the voltage control oscillator which has a value which is as nearly the same as possible with and without incoming signals.

SUMMARY OF THE INVENTION

A method for controlling the frequency of an oscillator in accordance with a reference frequency signal comprises generating a signal having a substantially 90° phase shift with respect to the reference signal, both of said signals having a substantially 50% duty cycle, phase detecting said two signals using a first exclusive-OR gate to produce a phase detector output signal, and filering said output signal to produce a frequency control signal, whereby said control signal has substantially the same amplitude regardless of the presence or absence of said reference signal.

DETAILED DESCRIPTION

Figure 1:
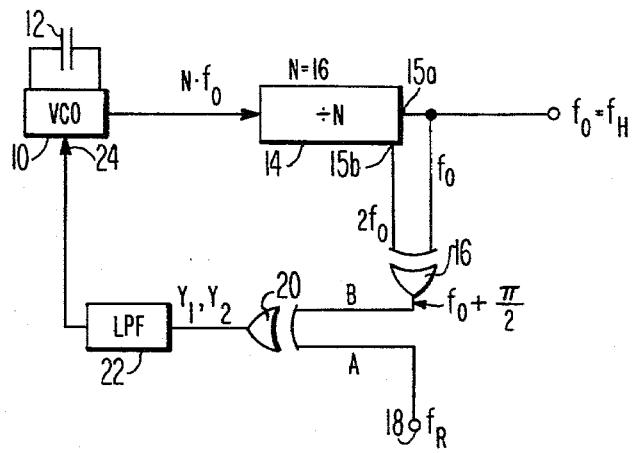
FIG. 1 shows a block diagram of the invention.
Figure 2:
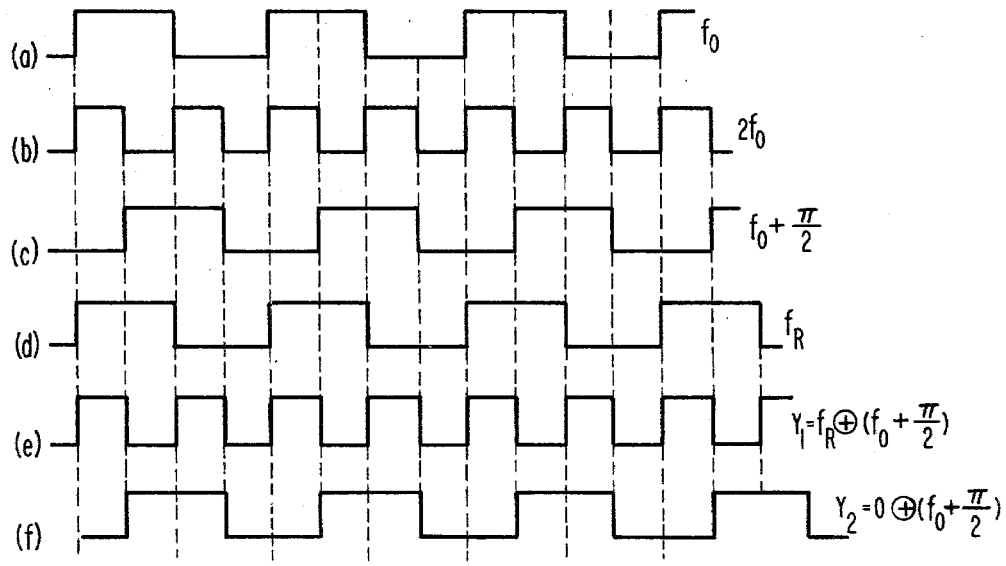
FIG. 2 shows waveforms present in FIG. 1.

FIG. 1 shows a voltage controlled oscillator 10 whose center frequency is approximately controlled by a capacitor 12 and which has a 251.7 kHz first output signal. The output signal is applied to the divide-by-N frequency divider 14. N in this particular embodiment is 16 so that the frequency of the divider 14 first output signal at output 15a is the horizontal sweep frequency in accordance with NTSC standards, i.e. 15.734 kHz. This output signal has the form of a 50% duty cycle square wave, which is shown in FIG. 2a, and is labelled "$f_o$". This output signal is applied to numerous places within a video tape recorder for timing purposes.

For reasons explained later, this first output signal is applied to a first input of an exclusive-OR gate 16. A second output signal from output 15b, which has double the frequency of the first output signal, i.e. $2f_o$, since output 15b is derived from the penultimate divider stage of divider 14, and which is shown in FIG. 2(b), is applied to a second input of gate 16. The output signal of the exclusive-OR gate 16 has the frequency $f_o$, but is shifted 90° with respect to the first output signal from divider 14, see FIG. 2(c). An incoming reference frequency signal is present at terminal 18, which reference signal is derived from an incoming video signal to be recorded or a reference video signal, e.g. color bars, or from a sync generator ("House sync"). The reference signal is in the form of a square wave with a 50% duty cycle, see FIG. 2(d). This reference signal and the output signal from gate 16 are applied to another exclusive-OR gate 20. Gate 20 acts as a phase discriminator, and delivers an output signal $Y_1$ equal to the exclusive-OR function of the reference frequency signal and the signal from gate 16. The output waveform of gate 20 when its input signals have the same frequency is again in the form of a 50% duty cycle square wave with double the horizontal frequency, as shown in FIG. 2(e). This output waveform with its 50% duty cycle is filtered by low pass filter 22 and applied to frequency control input 24 of VCO 10 for fine frequency control thereof about its center frequency determined by capacitor 12. The output signal from lowpass filter 22 has about half of the peak-to-peak amplitude of the square wave $Y_1$. For example, if the square wave $Y_1$ is a TTL waveform ranging between 0 and +4 volts, the average voltage of the low pass filter output signal then is half of this, i.e. 2 volts. If the incoming reference frequency signal at terminal 18 is not present, the second exclusive-OR gate 20, which acts as a phase discriminator, provides a square wave signal $Y_2$ equal to the exclusive-OR function of the signal coming from gate 16 and zero. The signal $Y_2$ has the frequency $f_o$, see FIG. 2(f), i.e. not a double frequency signal such as $Y_1$, but it again has a duty cycle of 50%. If one again assumes that this is a TTL waveform ranging between 0 and +4 volts, the average is again half of it, which is 2 volts. This shows that the control voltage for the VCO at terminal 24 is the same with or without the incoming reference signal. Therefore, in the absence of the reference frequency signal, the voltage controlled oscillator 10 is as close as possible to the standard frequency. Because the exclusive-OR gate discriminator 20 needs a 90° phase shift between the two waveforms which it compares, the first exclusive-OR gate 16 was used. The result is that the output signal from output 15a of the divide-by-N divider 14 and the incoming reference frequency signal $f_R$ are in phase, compare FIGS. 2(a) and (d), so that the leading and the trailing edges are in coincidence for proper recording machine timing. There is a slight deviation from this coincidence when the frequencies of the two signals are not exactly the same. The tolerances for an incoming NTSC reference signal are in the order $\pm 5.5 \times 10^{-6}$. The gain of the error voltage to frequency conversion operation within VCO 24 is made high enough so that the time offset between the incoming reference signal $f_R$ and the generated signal $f_o$ is within the allowed tolerance. Therefore, this simple circuit fulfills all the necessary requirements for a generator lock module as used in video tape machines.

It will be appreciated that the invention is not limited to recorders, but is useful for any generator lock function, such as cameras or sync generators.

What is claimed is:

1. A method for controlling the frequency of an oscillator in accordance with a reference frequency signal, said method comprising generating a signal derived from said oscillator and having a substantially 90° phase shift with respect to the reference signal, both of said signals having a substantially 50% duty cycle, phase detecting said two signals using a first exclusive-OR gate to produce a phase detector output signal, filtering said output signal to produce a frequency control signal, whereby said control signal has substantially the same amplitude regardless of the presence or absence of said reference signal, and applying said control signal to said oscillator, said generating step comprising frequency dividing the oscillator signal to produce a first signal having substantially the same frequency as that of the reference signal and a second signal having a frequency twice said first signal, and applying said first and second signals to a second exclusive-OR gate.

2. An apparatus for controlling the frequency of an oscillator in accordance with a reference frequency signal, said apparatus comprising means for generating a signal derived from said oscillator and having a substantially 90° phase shift with respect to the reference signal, both of said signals having a substantially 50% duty cycle, a first exclusive-OR gate means for phase detecting said two signals to produce a phase detector output signal, and means for filtering said output signal to produce a frequency control signal, whereby said control signal has substantially the same amplitude regardless of the presence or absence of said reference signal, said control signal being applied to said oscillator, and wherein said generating means comprises a frequency divider means for dividing the oscillator signal frequency to produce a first signal having substantially the same frequency as that of the reference signal and a second signal having a frequency twice said first signal, and a second exclusive-OR gate having a pair of inputs for receiving said first and second signals respectively.

3. An apparatus as claimed in claim 2, wherein said frequency divider means comprises a plurality of cascaded stages, and said second exclusive-OR gate inputs are coupled to the last and penultimate stages.

4. An apparatus as claimed in claim 2, wherein said filtering means comprises a low pass filter.

5. An apparatus as claimed in claim 2, wherein said generating means also produces another reference signal, said reference signals having a television horizontal frequency in accordance with a selected standard.

* * * * *